United States Patent [19]

Martin

[11] Patent Number: 5,739,700

[45] Date of Patent: Apr. 14, 1998

[54] METHOD AND APPARATUS WITH DUAL CIRCUITRY FOR SHIFTING THE LEVEL OF A SIGNAL

[75] Inventor: Douglas Ele Martin, Round Rock, Tex.

[73] Assignee: International Business Machines Corporation, Armonk, N.Y.

[21] Appl. No.: 709,706

[22] Filed: Sep. 9, 1996

[51] Int. Cl.⁶ .......................................... H03K 19/0185
[52] U.S. Cl. .............................. 326/80; 326/17; 326/68; 326/81
[58] Field of Search .............................. 326/17, 21, 63, 326/68, 80–81, 83, 121

[56] References Cited

U.S. PATENT DOCUMENTS

| | | | |
|---|---|---|---|
| 4,980,583 | 12/1990 | Dietz | 326/68 X |
| 5,068,551 | 11/1991 | Bosnyak | 326/17 X |
| 5,146,118 | 9/1992 | Nakamura et al. | 326/81 |
| 5,204,557 | 4/1993 | Nguyen | 326/17 X |
| 5,241,225 | 8/1993 | Okajima et al. | 326/17 X |
| 5,406,140 | 4/1995 | Wert et al. | 326/81 X |
| 5,526,314 | 6/1996 | Kumar . | |
| 5,559,465 | 9/1996 | Shah | 326/17 X |

Primary Examiner—David R. Hudspeth
Attorney, Agent, or Firm—Anthony V.S. England

[57] ABSTRACT

A method and apparatus is disclosed for outputting a signal responsive to, and shifted in signal level relative to, an input signal level. A driver includes first circuitry outputting a first signal responsive to an input signal, and second circuitry outputting a second signal responsive to the input signal. The first circuitry includes circuitry for substantially shifting the first signal level relative to the input signal and responds more slowly than the second circuitry. The driver output is responsive to both the first and second signals so that the second circuitry improves driver response.

8 Claims, 6 Drawing Sheets

5,739,700

METHOD AND APPARATUS WITH DUAL CIRCUITRY FOR SHIFTING THE LEVEL OF A SIGNAL

CROSS REFERENCE TO RELATED PATENT APPLICATIONS

None

FIELD OF THE INVENTION

This invention relates generally to drivers in information processing systems, and more specifically may apply to drivers for interfacing circuits having different voltage requirements, such as circuits fabricated by different CMOS technologies.

BACKGROUND OF THE INVENTION AND PRIOR ART

The internal voltage supply of an integrated circuit and the corresponding voltage level of signals which can be handled by the circuit are influenced by the requirements and limitations of fabrication technology used for the circuit. It is not unusual for a computer system to have integrated circuits which are fabricated using somewhat different technologies requiring different internal voltage supplies. These circuits within the system must nevertheless communicate with one another. For example, a microprocessor integrated circuit may be fabricated using a certain complementary metal oxide semiconductor ("CMOS") technology which requires a nominal 2.5 volt internal voltage supply (Vdd), while other devices which communicate with the microprocessor on the computer system interface bus or memory bus are fabricated using a somewhat different CMOS technology requiring a nominal 3.3 volt internal voltage supply (OVdd). The devices having the OVdd internal voltage supply may require an logic high signal, such as one inputted from the microprocessor, to approach OVdd, while the microprocessor can only supply a high level signal approaching Vdd. Also, if OVdd exceeds certain maximum source-to-drain or gate oxide breakdown voltages for FET's in a device, the device may require that a logic low signal, such as one inputted from the microprocessor, be limited to some voltage sufficiently above ground to prevent damage.

It is known by persons of reasonable skill in the art to use a half latch circuit as shown in FIG. 1 to shift the voltage level of a signal. The circuit has a first stage, drain-source coupled pair of FET's, P1 and N1, and a second stage, drain-source coupled pair of FET's, P2 and N2, with the PFET's supplied by a certain voltage Vhh. Coupled to the gate of FET N1 is an input signal with a high logical state at a voltage below that of Vhh and a low logical state at a still lower voltage level. The output of the first stage, is coupled to the gate of FET N2. The output of the second stage provides the half latch circuit output signal, and is also coupled back to the gate of FET P1.

The operation of the half latch circuit of FIG. 1 may be understood as follows. A high input signal turns on N1, pulling down the first stage output and turning on P2. The high input signal is complemented by the inverter and the resulting low inverter output signal turns off N2. With P2 on and N2 off, this pulls up the second stage output signal to a voltage level approaching Vhh. The high output signal is also fed back to the gate of PFET P1, turning off P1 so that P1 does not oppose the pulling down of the first stage output by N1.

A low input signal turns off N1, which does not affect the output of the first stage. The low input signal is also complemented by the inverter. The resulting high inverter output signal turns on N2, which tends to pull down the second stage output. However, a contention exists at this point because P2 remains on, tending to pull up the second stage output. In order to resolve this contention it is typical to select NFET N2 of a size capable of overdriving PFET P2 so that the output of stage 2 is pulled down when both N2 and P2 are on. The contention is further resolved when the low output signal is fed back to the gate of P1, turning on P1, pulling up the output of stage 1, and turning off P2. For a falling input signal, this contention between P2 and N2 in the prior art half latch circuit slows down transition of the output signal from the high to low logic states. It also increases power requirements.

In contrast to the above described problem of slow driver response, a somewhat opposite problem may occur in drivers, which is related to a certain aspect of extremely fast response. Specifically, a problem may exist when the rate of change in a driver's output is very high because a high rate of current rise may induce excessive noise into nearby power supplies.

A need therefore exists for an improved voltage level shifter ("driver") to couple different circuits together and shift the voltage level of signals sent from one circuit to the other.

SUMMARY OF THE INVENTION

An objective of the invention is to reduce driver response time for driving an output signal responsive to an input signal, where the voltage level of the output signal is shifted with respect to the input signal.

Another objective of the invention is to drive an output signal within a rate-of-change limit so that the signal does not create excessive noise.

According to the present invention, the foregoing and other objects are attained by a driver having first circuitry outputting a first signal responsive to an input signal, and second circuitry outputting a second signal responsive to the input signal. The first circuitry includes circuitry for substantially shifting the first signal level relative to the input signal and responds more slowly than the second circuitry. The driver output is responsive to both the first and second signals so that the second circuitry improves driver response.

The invention further contemplates that the second signal responds with less dead time, relative to a change in the input signal, than that of the first signal.

In a further aspect, the invention contemplates that the second signal response has a higher rate of change than the first signal response.

In yet a further aspect, the invention contemplates that the second circuitry does not substantially shift the second signal level relative to the input signal so that the first signal drives the driver output signal to a higher level than the second signal.

In still a further aspect, the invention contemplates that an output node of the first circuitry is operably connected to an output node of the second circuitry, and the second signal increasing above a certain threshold level tends to switch the second circuitry to a high output impedance state, allowing the first signal to drive the output signal to the higher level.

It is an advantage of the present invention that the input signal is shifted to a higher level output signal by the first circuitry, and driver response is sped up by the combination of the first and second circuitry.

It is another advantage that the invention achieves the faster response while limiting the rate of change in driver output signal.

Additional objects, advantages, and novel features are set forth in the following description, or will be apparent to those skilled in the art or those practicing the invention. Other embodiments are within the spirit and scope of the invention. These objects and embodiments may be achieved by the combinations pointed out in the appended claims. The invention is intended to be limited only as defined in the claims.

DESCRIPTION OF THE PREFERRED EMBODIMENT

To clearly point out novel features of the present invention, the following discussion omits or only briefly describes conventional features which are apparent to those skilled in the art concerning CMOS technology, and the driving of external loads by an off-chip driver such as the driver of the preferred embodiment. It is assumed that those skilled in the art are familiar with the details of CMOS technology, high frequency switching and transmission line effects, such as described in *Circuit Design for CMOS VLSI*, by John P. Uyemura, 1992, Kluwer Academic Publishers, which is hereby incorporated herein by reference.

Figure 2:
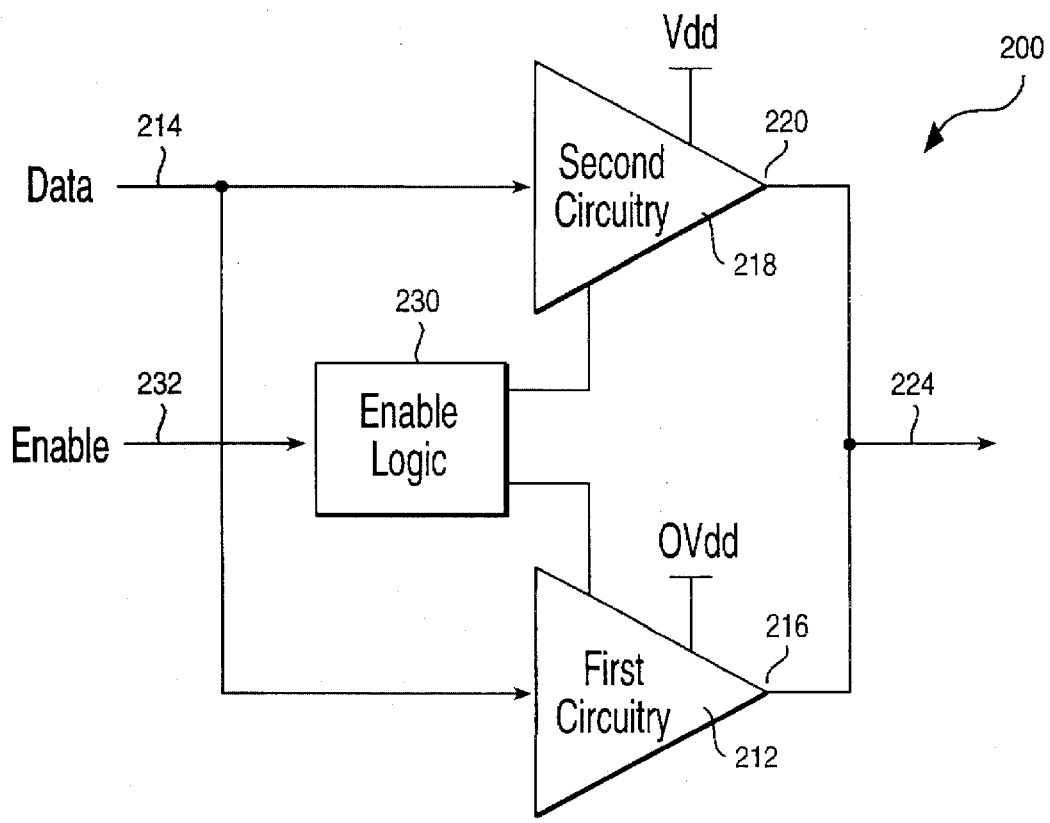
FIG. 2 is a block diagram of a device embodying the invention, showing first and second circuitry for generating signals responsive to an input signal.

Referring to FIG. 2, a block diagram of a preferred embodiment is shown. Driver 200 includes first circuitry 212, which is powered from voltage supply OVdd, receives data input at 214 and outputs a first signal at node 216 in response thereto. The circuitry 212 receives a data input signal having a voltage range from 0 to 2.5 Volts DC, and generates the first signal, in response thereto, which is shifted in voltage level with respect to the data input signal so that the voltage level of the first signal ranges from 0 to 3.3 Volts DC.

Likewise, the driver 200 includes second circuitry 218, powered from voltage supply Vdd, which receives data input data input 214 and outputs a signal at node 220 in response thereto. The circuitry 218 receives a data input signal having a voltage range from 0 to 2.5 Volts DC, and generates the second signal, in response thereto, which is not shifted in voltage level with respect to the data input signal so that the voltage level of the second signal essentially tracks to the voltage level of the input signal. However, the circuitry 218 is configured such that when the data input signal goes to a high state (i.e., a voltage level above 1.25 volts), the circuitry 218 initially drives the second signal to a high state tracking the voltage level of the data input signal, but then the circuitry 218 output switches to a high impedance state. In the high impedance state the circuitry 218 will allow the second signal to be held up but the circuitry 218 no longer drives the second signal to the high state.

The first circuitry 212 output node 216 and second circuitry 218 output node 220 are operably interconnected to provide the driver 200 output node 224. Since the first and second circuitry output nodes are thus interconnected, the driver 200 output signal at node 224 is responsive to both the first and second signals.

Also included in driver 200 is enable logic circuitry 230, operably connected to first circuitry 212 and second circuitry 218, which receives enable inputs 232 for disabling and enabling one or both of first circuitry 212 and second circuitry 218.

Figure 3:
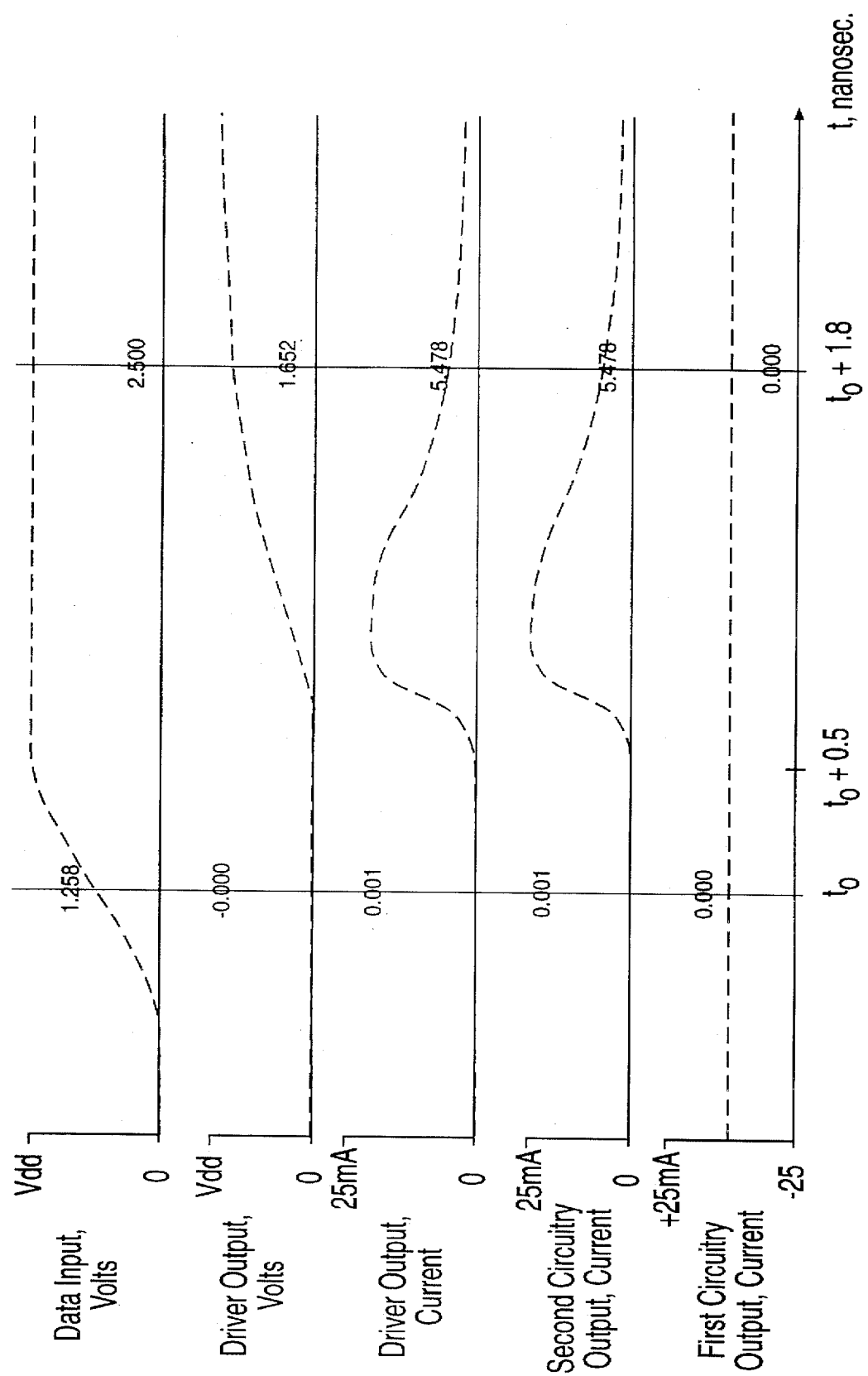
FIG. 3 illustrates the timing of various signals relating to the method and apparatus where first circuitry is disabled.

Referring now to FIG. 3, an initial condition is shown, prior to time t0, when the data input signal (at 214 in FIG. 2) to first and second circuitry is in a low state (i.e., at a voltage level below some predefined limit, such as 1.25 Volts DC), and the first and second signals, generated by first and second circuitry respectively, are also in a low state, with voltage level corresponding to the input signal. The input signal thereafter rises, and at time t0 reaches about 1.25 volts, the lower threshold of a logic high state for devices supplied by 2.5 volts. With only the second circuitry enabled, the driver output signal voltage (at node 224 in FIG. 2) begins to rise at about t0+0.5 nanoseconds, driven by the second circuitry output signal (output signal current shown at node 220) responsive to the input signal. By about t0+ 1.8 nanoseconds it has risen to about 1.65 volts, the threshold level for a logic high state for off-chip devices using a 3.3 volt supply. (The output signal current falls before t0+1.8 nanoseconds because the external transmission line has substantial capacitance and little resistance and therefore requires little current after it is initially charged.)

Figure 4:
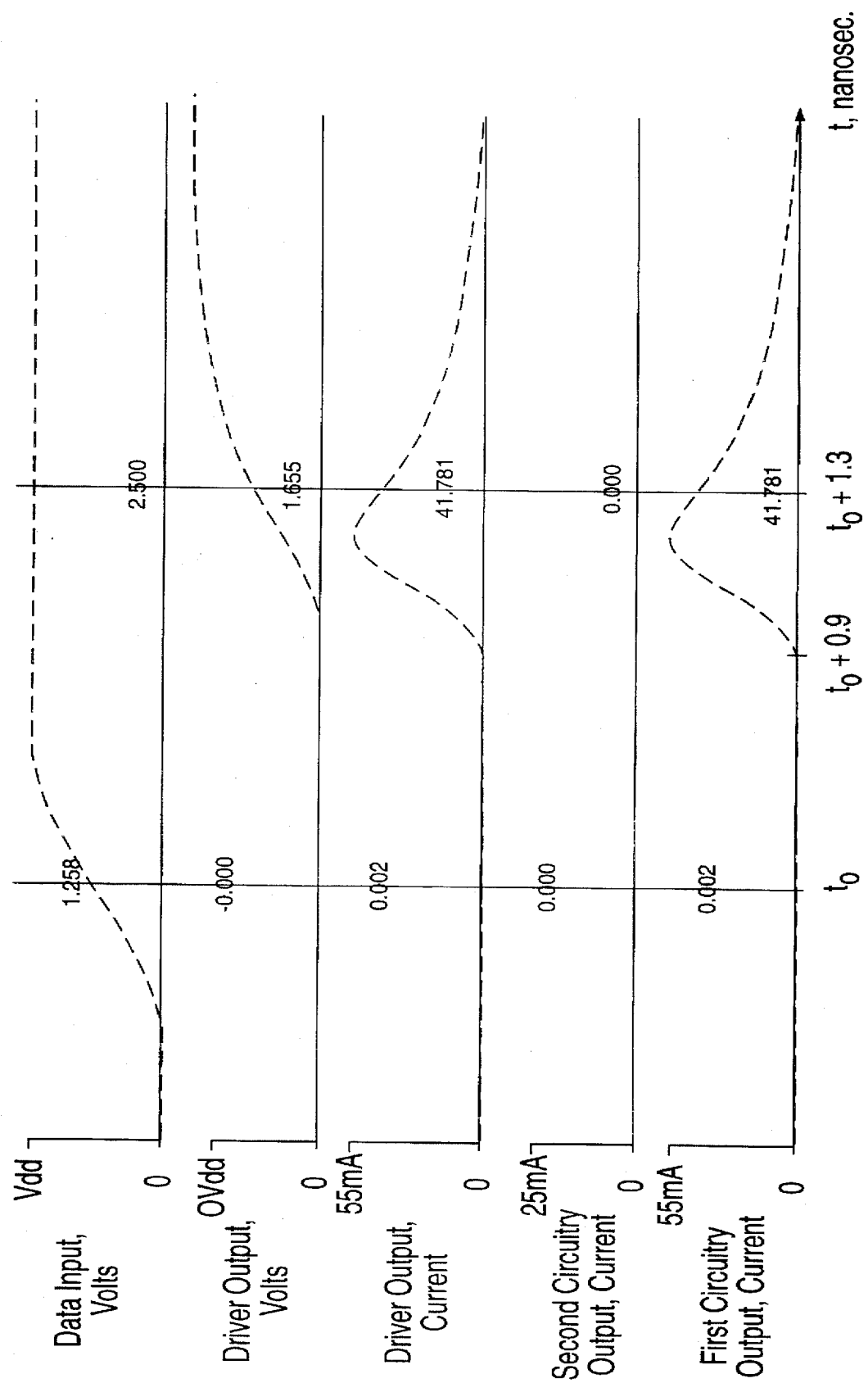
FIG. 4 illustrates the timing of various signals relating to the method and apparatus where second circuitry is disabled.

Referring now to FIG. 4, with only the first circuitry enabled, the driver output signal begins to rise at about t0+0.9 nanoseconds, responsive to the input signal, and by about t0+1.3 nanoseconds has risen to about 1.65 volts.

Figure 5:
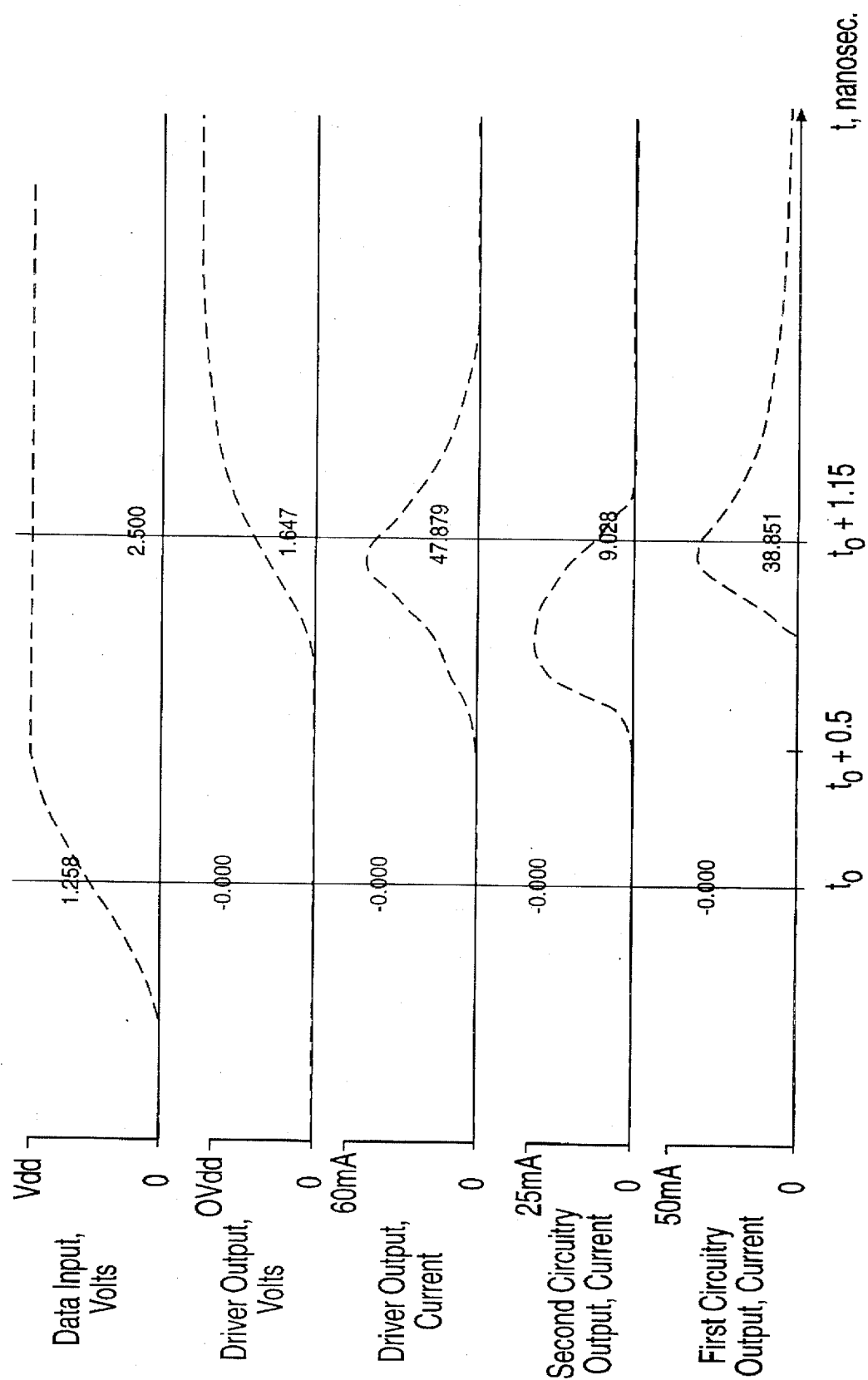
FIG. 5 illustrates the timing of various signals relating to the method and apparatus where both first and second circuitry are enabled.

Referring now to FIG. 5, with the both the first and circuitry enabled, the driver output signal begins to rise at about t0+0.5 nanoseconds, responsive to the input signal, and by about t0+1.15 nanoseconds has risen to about 1.65 volts.

Summarizing the above, the second circuitry output signal begins rising more quickly in response to a rising input signal than does the first circuitry output signal. Specifically, the first signal does not begin to rise until after a certain time interval with essentially no change (such an interval being referred to herein as a "dead time" interval), shown in FIG. 5 from time t0 to time t0+0.5 nanoseconds, whereas the second signal begins to rise after a shorter dead time interval, from t0 to t0+ 0.9 nanoseconds. On the other hand, while the second circuitry output signal begins rising with less dead time, it does not rise a fast as the first circuitry output signal. By combining the outputs signals of the first and second circuitry, the overall response of the driver 200 is improved. The dead time is reduced due to the response of the second circuitry, while the rate of rise is faster than the rate of rise of the second circuitry, due to including the first circuitry.

Figure 6:
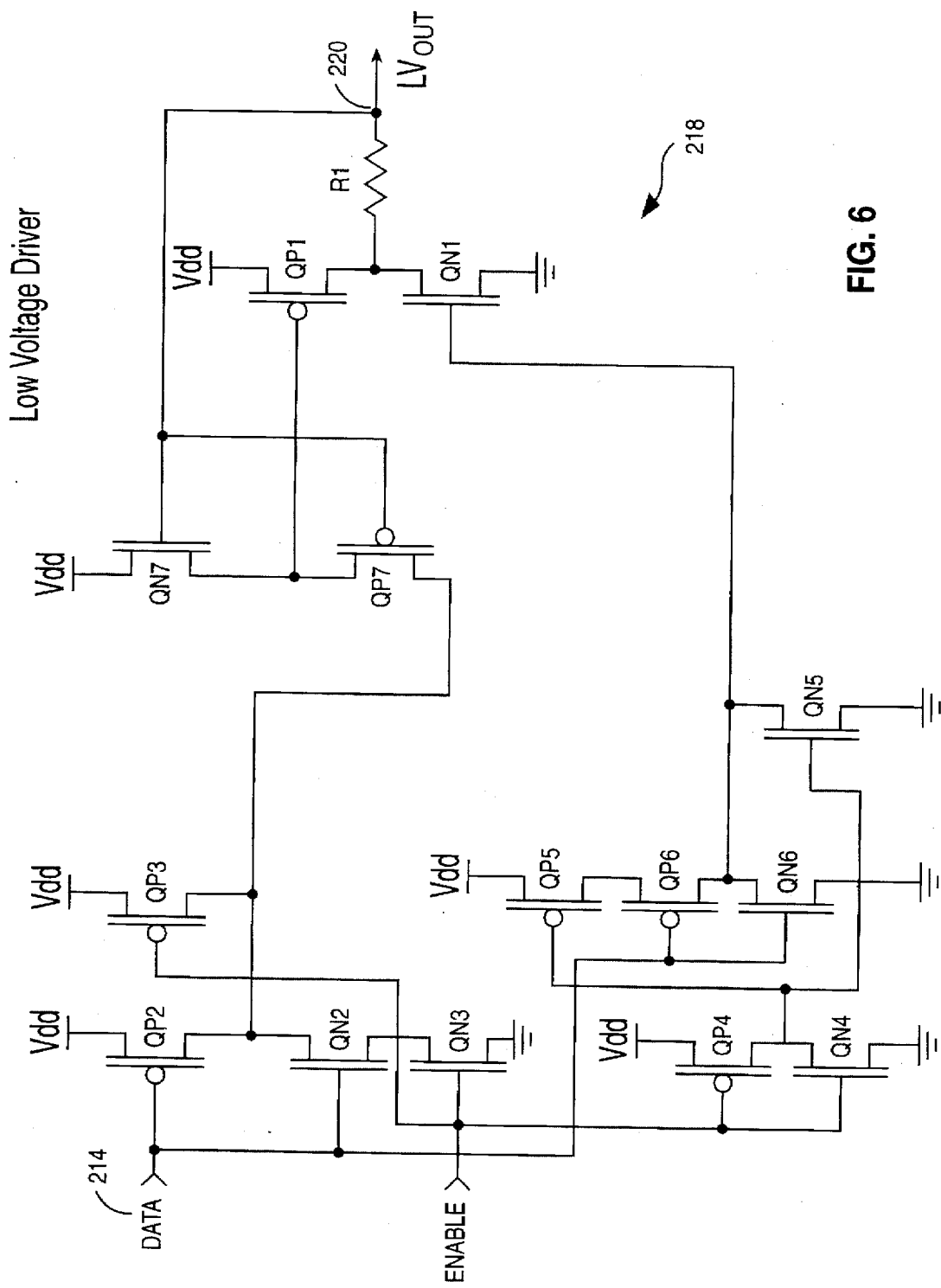
FIG. 6 is a schematic diagram of the second circuitry of the driver.

Referring now to FIG. 6, a preferred circuit for the second circuitry is shown. The data input signal line is connected to the gate of PFET QP2 and NFET QN2, as well as FET's QP6 and QN6. The Enable signal line is connected to the gates of QN3, QP3, QN4 and QP4. QN4 and QP4 are connected as an inverter supplied by Vdd to invert the Enable signal received at their gates. The output of the QN4/QP4 inverter is fed to the gate of QP5, which also is supplied at its source by Vdd, and the gate of QN5, which has its source grounded. These FET's, QN3, QP3, QN4, QP4, QN5 and QP5, are connected to i) enable the input stage FET's QN2, QP2, QN6 and QP6, i.e., the FET's which receive the data input signal, so that the circuit is responsive to the input signal, or ii) disable the input stage FET's while turning off both output stage FET's, QP1 and QN1, so that the output impedance of the circuit is high regardless of the input signal.

These input stage FET's invert the data input signal. The source of output stage FET QN1 is grounded, while its drain is connected to the drain of QP1, and through the source of QP1 to power supply Vdd. With the circuit enabled, the QP6/QN6 input stage inverter tends to turn on QN1 if the data input signal is low, and to turn off QN1 if the data input signal is high.

The drains of QP1 and QN1 are connected to an output resistor R1, and through the resistor R1 to the second circuitry output node 220. Also connected to the output node 220 are the gates of QN7 and QP7, which have their drains interconnected and tied back to the gate of QP1. The source of QN7 is connected to Vdd. The source of QP7 is connected to the output (i.e., the drains) of input stage inverter QP2/QN2.

With the second circuitry enabled, and the data input signal low so that QP6/QN6 tends to turn on QN1, the signal at the output node 220 is pulled down, which tends to turn on QP7 and turn off QN7. With QN7 on this tends to turn off QP1 so that QP1 does not oppose QN1 pulling down the signal at the output node 220. Also, with the data input signal low the QP2/QN2 input stage inverter tends to pull up the voltage at the source of QP7 which also tends to turn off, or to not oppose turning off QP1, so that the second circuitry actively pulls down the second signal at the output node 220.

With the second circuitry enabled, when the data input signal goes high, QP6/QN6 tends to turn off QN1. Also, QP2/QN2 tends to pull the voltage at the source of QP7 low, which tends to turn on QP1 through the drain of QP7 tied to the gate of QP1, and tends to pull up the second signal at the output node 220. The second signal going high tends to turn on QN7 and turn off QP7. This in turn tends to pull up the voltage at the gate of QP1, through the source of QN7 tied to Vdd and the drain of QN7 tied to the gate of QP1, and turn off QP1. Thus, the second signal going high tends to turn off both output stage FET's QN1 and QP1, putting the second circuitry output in a high impedance state which allows the second signal to be held up, but no longer drives it.

Figure 7:
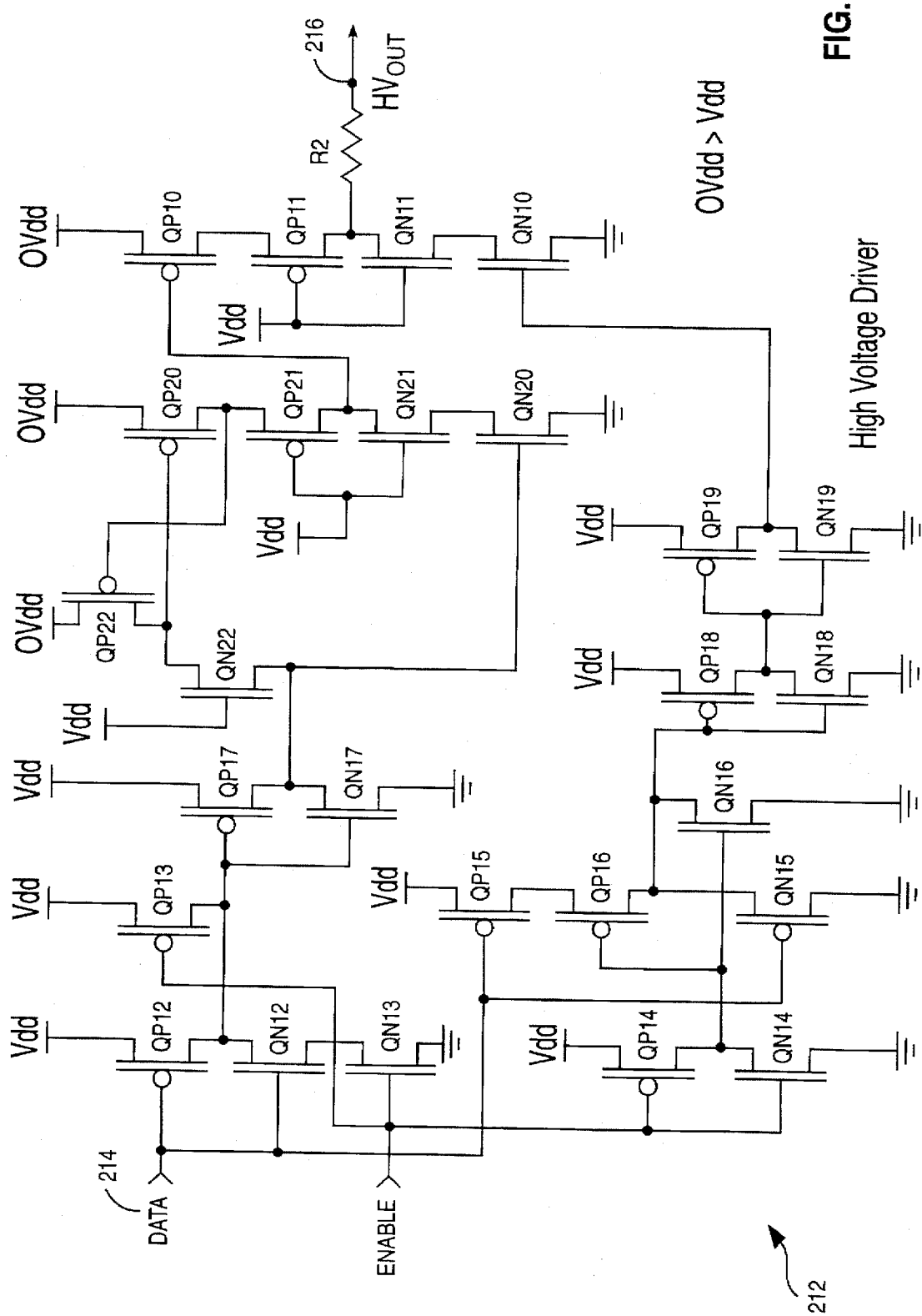
FIG. 7 is a schematic diagram of the first circuitry of the driver, including circuitry for shifting the input signal level.

Referring now to FIG. 7, a preferred circuit for the second circuitry is shown. The data input signal line is connected to the gates of PFET QP12 and NFET QN12, as well as FET's QP16 and QN16. The Enable signal line is connected to the gates of QN13, QP13, QN14 and QP14. QN14 and QP14 are connected as an inverter supplied by Vdd to invert the Enable signal received at their gates. The output of the QN14/QP14 inverter is fed to the gate of QP15, which is supplied at its source by Vdd, and the gate of QN5, which has its source grounded. These FET's QN13, QP13, QN14, QP14, QN15 and QP15 are connected to i) enable the input stage FET's QN12, QP12, QN16 and QP16, i.e., the FET's which receive the data input signal, or ii) disable them while turning off QP10 and turning on QN10 so as to drive the first signal low.

Figure 1:
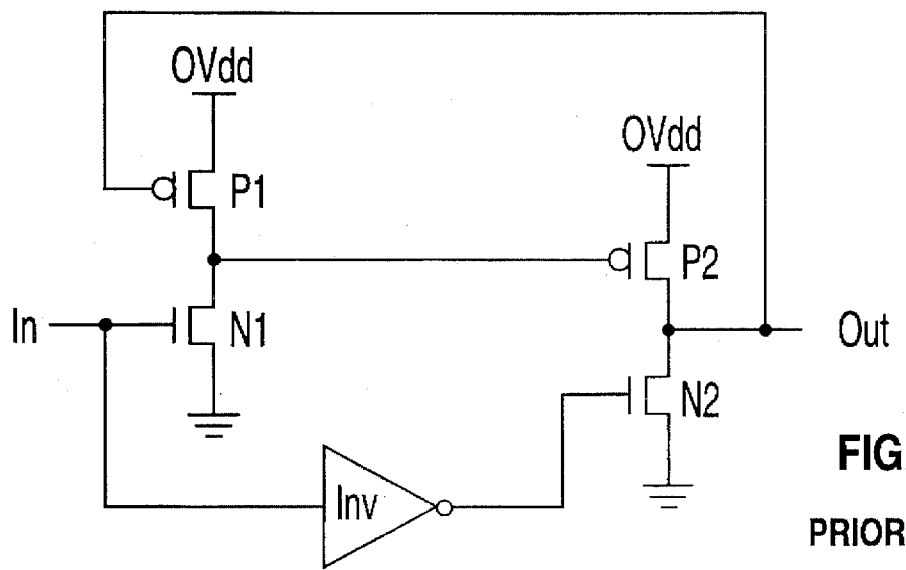
FIG. 1 is a schematic diagram of a prior art half latch circuit, useful in shifting the level of an input signal.

These input stage FET's invert the data input signal. QP12/QN12 drains are connected to the gates of QP17/QN17, which are connected as an inverter, supplied from Vdd, to drive the gate of QN20. QN20/QP20 and QN22/QP22 are connected in similar fashion as the prior art half-latch (FIG. 1), but with the addition of QN21/QP21 for overvoltage protection to protect QN20 from overvoltage due to OVdd connected to QN20 through QP20, an additional output stage QP10/QN10, QN11/QP11 providing similar overvoltage protection for QN10, and an output resistor R2 connected to output node 216. QP16/QN16 drains are connected to the gates of QP18/QN18, which are connected as an inverter, supplied from Vdd, to drive the gates of QP19 and QN19, which are also connected as an inverter, supplied from Vdd, to drive the gate of QN10.

When the data signal is low, and is inverted by QP16/QN16, then QP18/QN18, and then QP19/QN19 to turn on QN10 so that QN10 tends to pull down the first signal to a low state. At the same time, the data signal is inverted by QN12/QP12, then QN17/QP17, tending to turn off QN20 and to turn on QP20 (through QN22), tending to turn off QP22 (through QP20) to stop contention between QP17/QN17 tending to turn off QN20, and QP22 tending to turn on QN20. With QN20 off and QP20 on, this tends to turn off QP10 so that QP10 does not oppose QN10 tending to pull the first signal low.

When the data signal is high, and is inverted by QN12/QP12, then QN17/QP17, tending to turn on QN20 and turn off QP20 (through QN22), this tends to pull down the gate of QP10 and turn on QP10. Turning on QP10 tends to pull the first signal to a high state, approaching OVdd through QP10. At the same time, the data signal is inverted by QP16/QN16, then QP18/QN18, and then QP19/QN19 to turn off QN10 so that QN10 does not oppose QP10 pulling the first signal high.

From the above description of the operation of first and second circuitry, it may be seen how their combination is advantageous. Since the first and second circuitry output nodes are interconnected to the driver output node, the first circuitry is assisted by the second circuitry in pulling the driver output signal up to a high state or down to a low state. Also, since the second signal responds with less dead time than the first signal, the driver output signal reaches the high or low state faster than it would by use of the first circuitry alone. Furthermore, the first circuitry drives the output signal above the voltage level, Vdd, which the second circuitry can achieve, and does so without opposition by the second circuitry, since the second circuitry switches to a high impedance state after initially driving the second signal to near Vdd. Also, the first signal going high tends to hold up the second signal once the second circuitry has gone into the high output impedance state.

Note also, that the output resistors 222 and 226 are sized to achieve a certain degree of matching between output impedance of the driver 200 and impedance of the external (not shown) transmission line and its loads. As is understood by persons of ordinary skill in the art, there are tradeoffs between driver response, driver and transmission line impedance, signal loss and noise. Since the second circuitry switches to a high output impedance state after initially driving the second signal to near Vdd, the driver output rate of change is maintained within a desired limit to avoid creating excessive noise in the system.

Although the present invention and its advantages have been described in detail, it should be understood that various changes, substitutions and alterations can be made without departing from the spirit and scope of the invention as defined by the following claims.

What is claimed is:

1. A driver for outputting a digital logic signal responsive to, and shifted in voltage level relative to, a digital logic input signal, the driver comprising:

first circuitry outputting a first signal responsive to, but at higher voltage level than, an input signal; and second circuitry outputting a second signal responsive to, and at substantially the same voltage level as, the input signal, so that the second signal responds faster than the first signal;

wherein the driver output signal is responsive to both the first and second signals, so that the second circuitry improves driver output signal response.

2. The driver of claim 1, wherein an output node of the first circuitry is operably connected to an output node of the second circuitry so that the second circuitry is responsive to the first signal.

3. The driver of claim 2, wherein the driver output signal increasing above a certain threshold voltage level tends to switch the second circuitry to a high output impedance state so that the first signal drives the driver output signal to the higher level.

4. The driver of claim 3, further comprising:

first power supply for first circuitry; and second power supply for first and second circuitry;

wherein the second power supply has a lower voltage level than the first power supply.

5. The driver of claim 4, wherein the faster response of the second signal comprises a smaller dead time.

6. A method for outputting a digital logic signal responsive to, and shifted in voltage level relative to, a digital logic input signal, the method comprising:

outputting a first signal responsive to, but at higher voltage level than, an input signal; and outputting a second signal responsive to, and at substantially the same voltage level as, the input signal so that the second signal responds faster than the first signal;

outputting a driver output signal is responsive to both the first and second signals, so that the second signal improves driver output signal response.

7. The method of claim 6, wherein the driver output signal increasing above a certain threshold voltage level tends to switch circuitry for the second signal to a high output impedance state so that the first signal drives the driver output signal to the higher level.

8. The method of claim 7, wherein the faster response of the second signal comprises a smaller dead time.

* * * * *

UNITED STATES PATENT AND TRADEMARK OFFICE
CERTIFICATE OF CORRECTION

PATENT NO : 5,739,700
DATED : April 14, 1998
INVENTOR(S) : Martin

It is certified that error appears in the above-identified patent and that said Letters Patent is hereby corrected as shown below:

Column 4, line 53: change "0.5" to --0.9--.
Column 4, line 55: change "0.9" to --0.5--.
Column 5, line 53: change "second" to --first--.
Column 8, line 15: delete "is".

Signed and Sealed this

Second Day of March, 1999

*Attest:*

Q. TODD DICKINSON

*Attesting Officer*     *Acting Commissioner of Patents and Trademarks*